(12) United States Patent
Jiang et al.

(10) Patent No.: US 11,567,417 B2
(45) Date of Patent: Jan. 31, 2023

(54) ANTI-SLIPPERY STAMP LANDING RING

(71) Applicant: Applied Materials, Inc., Santa Clara, CA (US)

(72) Inventors: Jing Jiang, Santa Clara, CA (US); Suraj Yadav, San Jose, CA (US); Amita Joshi, Fremont, CA (US); Vivian Hsu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/579,349

(22) Filed: Jan. 19, 2022

(65) Prior Publication Data

US 2022/0229370 A1 Jul. 21, 2022

Related U.S. Application Data

(60) Provisional application No. 63/139,614, filed on Jan. 20, 2021.

(51) Int. Cl.
*G03F 7/20* (2006.01)
*G02B 6/26* (2006.01)

(52) U.S. Cl.
CPC .............. *G03F 7/707* (2013.01); *G02B 6/26* (2013.01)

(58) Field of Classification Search
CPC ......... G02B 6/26; G03F 7/707; G03F 7/0002; G03F 9/703; G03F 9/7042
See application file for complete search history.

(56) References Cited

U.S. PATENT DOCUMENTS

| | | | |
|---|---|---|---|
| 7,754,131 B2 | 7/2010 | Olsson et al. | |
| 7,766,640 B2 | 8/2010 | Stewart et al. | |
| 2007/0264588 A1 | 11/2007 | Sreenivasan et al. | |
| 2010/0039747 A1* | 2/2010 | Sansoni | H01L 21/67103 |
| | | | 361/234 |
| 2014/0110879 A1 | 4/2014 | O'Hare et al. | |
| 2016/0170313 A1* | 6/2016 | Funabashi | H01L 21/68742 |
| | | | 355/72 |
| 2017/0050351 A1 | 2/2017 | Mizuta et al. | |
| 2018/0040499 A1* | 2/2018 | Anada | H01L 21/68735 |
| 2018/0308740 A1* | 10/2018 | Achanta | H01L 21/687 |
| 2019/0263032 A1 | 8/2019 | Tan et al. | |
| 2019/0294041 A1 | 9/2019 | McMackin et al. | |
| 2019/0317397 A1* | 10/2019 | Sato | G03F 7/0002 |
| 2022/0037133 A1* | 2/2022 | Hama | H01L 21/02046 |

FOREIGN PATENT DOCUMENTS

JP 2007283674 A 11/2007

OTHER PUBLICATIONS

International Search Report and Written Opinion dated May 18, 2022 for Int'l App. No. PCT/US2022/012946.

\* cited by examiner

*Primary Examiner* — Deoram Persaud
(74) *Attorney, Agent, or Firm* — Patterson + Sheridan, LLP

(57) ABSTRACT

Apparatus and methods of performing nanoimprint lithography using an anti-slip landing ring are provided. In one embodiment, a process chamber for nanoimprint lithography is provided and includes a substrate support and a ring disposed on the substrate support. The ring has a top surface opposite the substrate support, and the top surface has a grid pattern. A bottom surface facing the substrate support has a different pattern compared to the grid pattern.

20 Claims, 7 Drawing Sheets

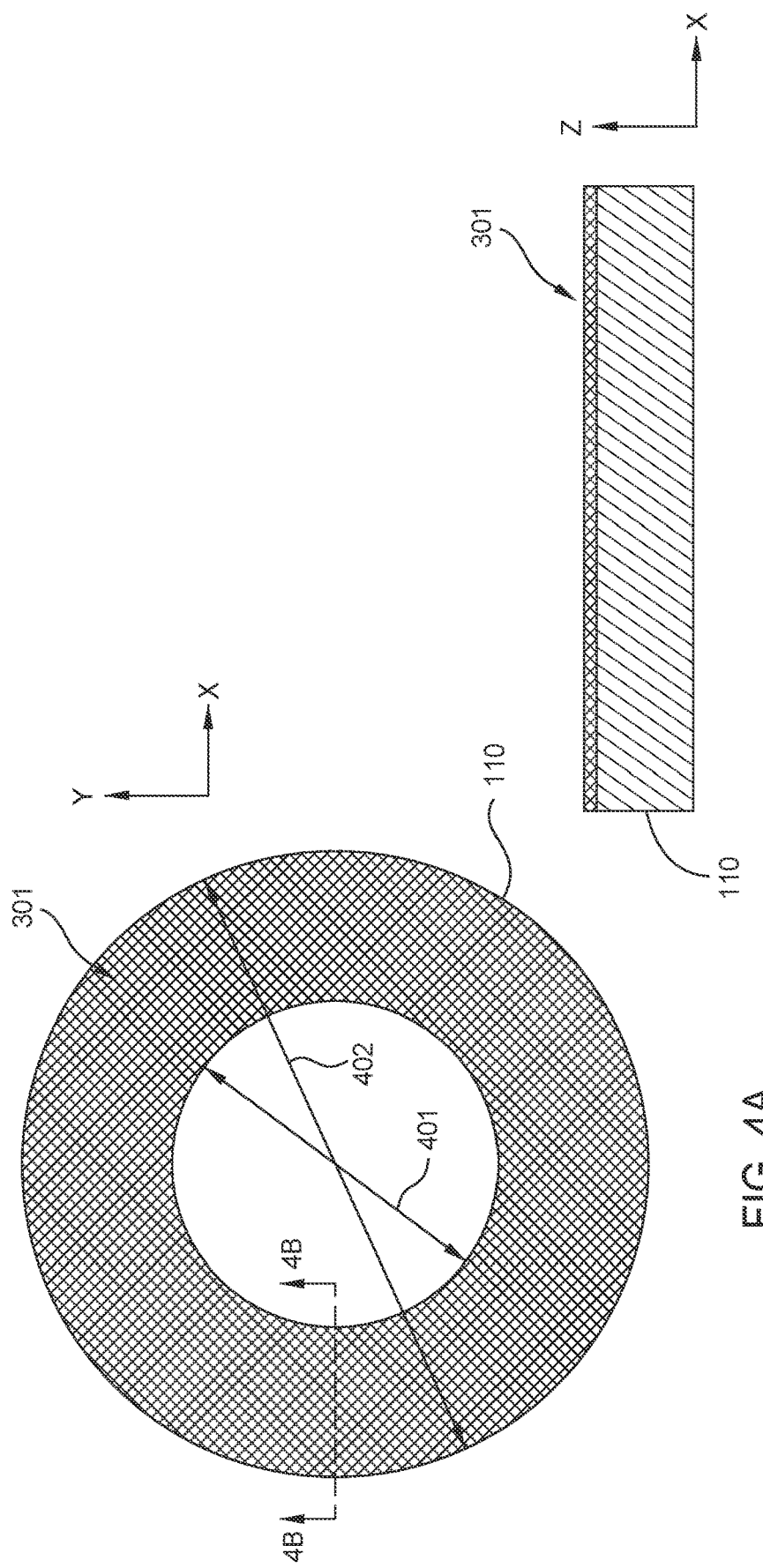

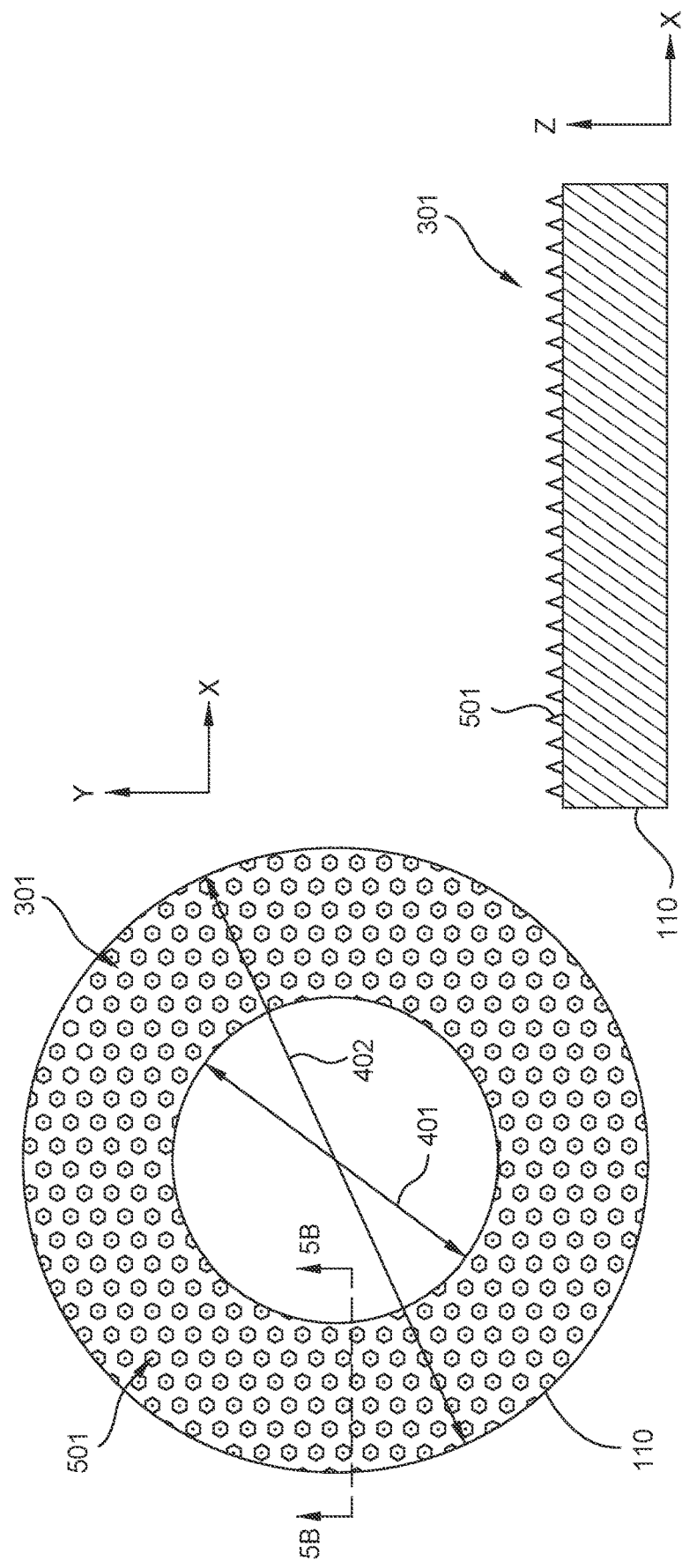

ANTI-SLIPPERY STAMP LANDING RING

CROSS-REFERENCE TO RELATED APPLICATIONS

This application claims benefit of United States Provisional Patent Application No. 63/139,614, filed Jan. 20, 2021, which is herein incorporated by reference in its entirety.

BACKGROUND

Field

Embodiments of the present disclosure generally relate to nanoimprint lithography. In particular, embodiments described herein relate to apparatus and methods for performing nanoimprint lithography using an anti-slip landing ring.

Description of the Related Art

Optical devices may be used to manipulate the propagation of light by spatially varying various structural parameters (e.g., shape, size, orientation) of structures of the optical devices formed on a substrate. These structures may be formed by various methods, for example nanoimprint lithography. In optical device fabrication using nanoimprint lithography, a stamp patterns the substrate in order to create the desired structures of the optical device. However, slipping of the stamp during patterning may result in undesirable inaccuracies in pattern placement on the substrate.

Accordingly, what is needed in the art are apparatus and methods for performing nanoim print lithography with reduced slipping.

SUMMARY

Apparatus and methods for performing nanoimprint lithography using an anti-slip landing ring are provided. In one embodiment, a process chamber for nanoimprint lithography is provided and includes a substrate support and a ring disposed on the substrate support. The ring has a top surface opposite the substrate support, and the top surface has a grid pattern. A bottom surface of the ring facing the substrate support has a different pattern compared to the grid pattern.

In another embodiment, a process chamber for nanoimprint lithography is provided and includes a substrate support and a ring disposed on the substrate support. The ring has a top surface opposite the substrate support, and the top surface has a pointed pattern. A bottom surface facing the substrate support has a different pattern compared to the pointed pattern.

In another embodiment, a process chamber for nanoimprint lithography is provided and includes a substrate support and a ring disposed on the substrate support. The ring has a top surface opposite the substrate support, and the top surface has an adhesive coating disposed thereon. A bottom surface facing the substrate support is uncoated with the adhesive.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4A is a schematic, top view of a ring having a grid pattern according to embodiments of the disclosure.

FIG. 4B is a schematic, cross-sectional view of the ring of FIG. 4A according to embodiments of the disclosure.

FIG. 5A is a schematic, top view of a ring having a pointed pattern according to embodiments of the disclosure.

FIG. 5B is a schematic, cross-sectional view of the ring of FIG. 5A according to embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to nanoimprint lithography. In particular, embodiments described herein relate to apparatus and methods for performing nanoimprint lithography using an anti-slip landing ring. In nanoimprint lithography, slipping of the stamp during the first contact between the stamp and substrate and/or the stamp and landing ring may result in pattern shifting and other processing irregularities. The pattern shift can affect the alignment accuracy and overall pattern placement on the substrate. Aspects disclosed herein reduce slipping between the substrate and stamp during stamping, improving patterning accuracy.

Figure 1:
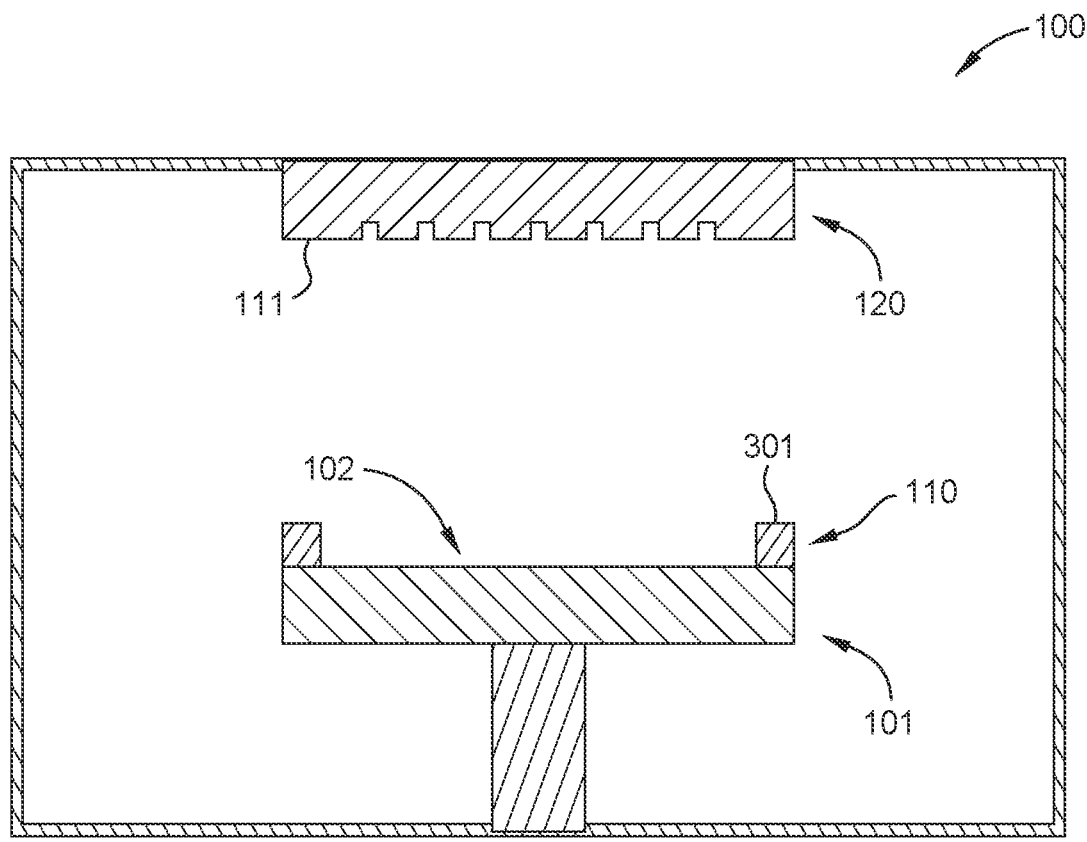
FIG. 1 is a schematic, cross-sectional view of a process chamber according to embodiments of the disclosure.

FIG. 1 is a schematic, cross-sectional view of a process chamber 100 according to embodiments. The process chamber 100 is configured to fabricate optical devices such as waveguide combiners. The process chamber 100 includes a substrate support 101 configured to support a substrate (not shown) and optionally control the temperature thereof via heating and/or cooling. In some embodiments, which can be combined with other embodiments, the substrate support 101 is a vacuum chuck, an electrostatic chuck, or any other suitable type of chuck. The substrate support 101 has a top surface 102 with a ring 110 disposed thereon. In some embodiments, which can be combined with other embodiments, the ring 110 is mounted to the top surface 102 of the substrate support 101. In some embodiments, which can be combined with other embodiments, the ring 110 is fabricated as a part of the substrate support 101 (e.g., monolithic therewith). In embodiments where the ring 110 is mounted to the top surface 102 of the substrate support 101 or fabricated as a part of the substrate support 101, the ring 110 may have a height that matches any desired height, such as the height of a top surface of a substrate (not shown), within a predetermined tolerance, such as +/−1 percent, 3 percent, 5 percent, 10 percent, 20 percent, or 25 percent. In some embodiments, which can be combined with other embodiments, the ring 110 is supported by a lift drive that can adjust the height of the ring 110 to match any desired height, such as the height of a top surface of a substrate (not shown). It is contemplated that the ring 110 and the substrate support 101 may each include mating features that facilitate mechanical engagement between the ring 110 and the substrate support 101.

In some embodiments, which can be combined with other embodiments, the ring 110 is formed from aluminum, stainless steel, or a ceramic such as silicon oxide, silicon nitride, silicon carbide, or aluminum oxide. In some embodiments, which can be combined with other embodiments, the ring 110 has a coating of anodized aluminum, polyetheretherketone (PEEK), Teflon, or another suitable polymer coating. The ring 110 has an inner diameter of about 100 millimeters (mm) to about 310 mm, for example about 105 mm to about 110 mm, for example about 155 mm to about 160 mm, for example about 205 mm to about 210 mm, for example about 305 mm to about 310 mm. The inner diameter of the ring 110 is greater than a diameter of the substrate (not shown) to be disposed on the substrate support 101. The dimensions of the ring 110 enable the ring 110 to surround the substrate (not shown) as the substrate is supported by the substrate support 101.

A stamp 120 is disposed in the process chamber 100 opposite the substrate support 101. During processing, the stamp 120 lowers, e.g., in a vertical direction, to contact a top surface of the substrate (not shown) in order to pattern the substrate or a portion of the substrate with the patterning surface 130. In addition, the stamp 130 is positioned to also contact an upper surface of the ring 110 during the stamping operation. The stamp 130 includes a radially outward ring contact area 111, which is generally planar or unpatterned, which engages the ring 110. In some embodiments, the ring contact area 111 may include features that increase frictional forces between the stamp 130 and ring 110 to facilitate reduced slippage therebetween. It is contemplated that the ring contact area 111 may contact 100 percent of the upper surface 301 of the ring 110, or less than 100 percent. The patterning of the substrate is further depicted in FIGS. 2A-2C.

Figure 2A:
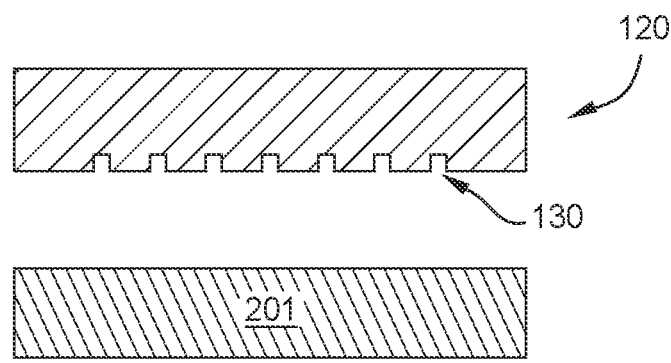
FIGS. 2A-2C are schematic, cross-sectional views of a stamping process.
Figure 2B:
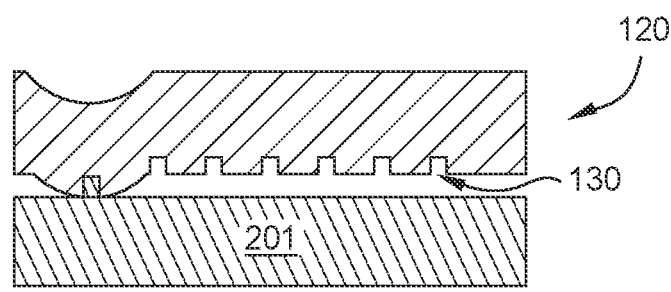
Figure 2C:
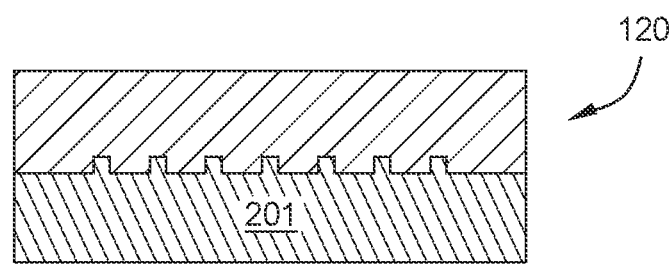

FIGS. 2A-2C are schematic, cross-sectional views of a stamping process. The stamping process patterns a substrate 201 using the stamp 120. The substrate 201 may be any suitable material. In some embodiments, the substrate 201 is a silicon-containing substrate. It is also contemplated that the substrate 201 may be an indium-, gallium-, germanium-, nitrogen-containing substrate, or other substrate. In some embodiments, which can be combined with other embodiments, the substrate 201 comprises niobium oxide, silicon oxycarbide, titanium oxide, lanthanum oxide, or zirconium oxide. Alternatively or additionally, the substrate 201 may be a layered substrate.

The stamping process includes aligning the stamp 120 with the substrate 201 as shown in FIG. 2A. The proper alignment of the stamp 120 with the substrate 201 improves processing repeatability by ensuring that the substrate 201 is patterned on the same location throughout batches of substrates. However, slipping during the first contact of the stamp 120 on the substrate 201 as shown in FIG. 2B may result in misalignment of the stamp 120 and the substrate 201. In one example, slippage may be movement of the stamp 120 relative to the substrate 201 in a direction other than orthogonal to the substrate 201. By increasing the frictional forces of the ring 110 on the stamp 120, misalignment of the stamp 120 relative to the substrate 201 is minimized via reduced slippage of the stamp 120. The stamp 120 patterns the substrate 201 as shown in FIG. 2C through capillary forces. Once the stamp 120 is removed from the substrate 201, the pattern formed through capillary forces remains.

Figure 3A:
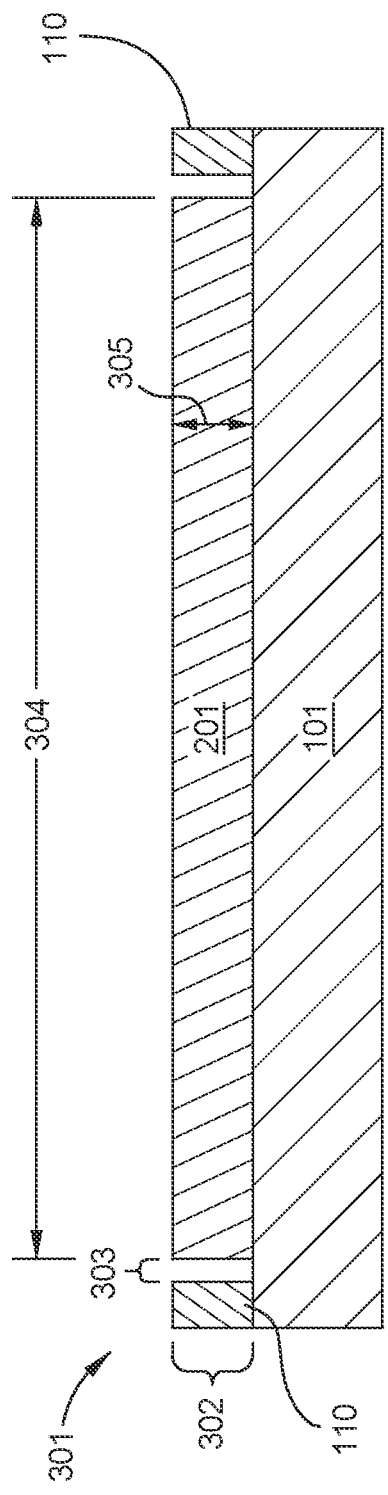
FIG. 3A is a schematic, cross-sectional view of a portion of the process chamber of FIG. 1 according to embodiments of the disclosure.

FIG. 3A is a schematic, cross-sectional view of a portion of the process chamber 100 shown in FIG. 1 according to embodiments. In some embodiments, which can be combined with other embodiments, a gap 303 between the ring 110 and the substrate 201 is about 0 cm to about 1 cm. In some embodiments, which can be combined with other embodiments, a thickness 302 of the ring 110 is within about 1 mm of a thickness 305 of the substrate 201 in order to minimize disruption of the stamp 120. For example, the difference in vertical thickness between the substrate 201 and the ring 302 may be less than 1 percent, such as less than 5 percent, such as less than 10 percent, such as less than 20 percent, such as less than 50 percent of the thickness of the substrate 201. In some embodiments, which can be combined with other embodiments, the thickness 302 of the ring 110 is about 0.3 mm to about 10 mm, such as 6 mm, or about 0.3 to about 0.8 mm, or about 0.7 mm to about 1.1 mm, such as about 0.7 mm to about 1.0 mm or about 0.7 mm to about 0.8 mm. In some embodiments, which can be combined with other embodiments, a diameter 304 of the substrate 201 is about 100 mm to about 300 mm, for example about 100 mm, for example about 150 mm, for example about 200 mm, for example about 300 mm.

Figure 3B:
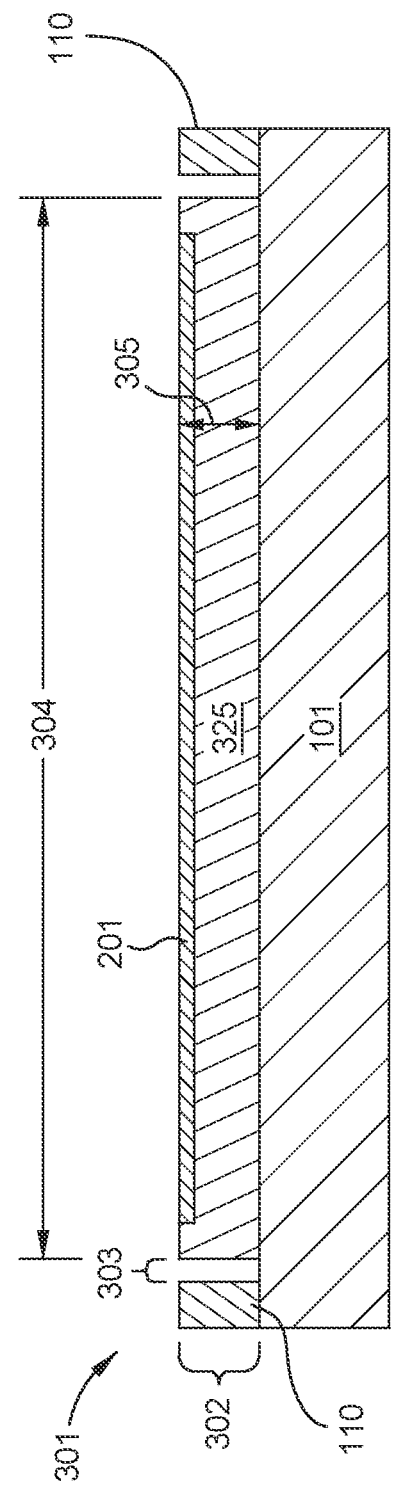
FIG. 3B is a schematic, cross-sectional view of a portion of the process chamber according to other embodiments.

As illustrated in FIG. 3B, the substrate 201 may be replaced by a substrate carrier 325 which is configured to hold the substrate 201 (such as a semiconductor wafer or optical device). In such a configuration, the carrier 325 may be formed from the same material as the ring 110, or the carrier may be formed from another material, such as silicon oxide, silicon nitride, graphite, and/or silicon carbide. As illustrated in FIG. 3B, the thickness 302 of the ring 110 is selected such that the top surface of the ring 110 is approximately coplanar with a top surface of the substrate 201 and/or the carrier 325. For example, the ring 110 may have a thickness 302 of about 5.5 mm to about 6.5 mm.

As shown in FIG. 4A, a top surface 301 of the ring 110 may be patterned and/or coated in order to increase frictional forces between the stamp 120 and the ring 110 and/or the stamp 120 and a substrate 201. The pattern may include rows, columns, cross-hatching, concentric arrangements of features, bead-blasted surfaces, or other texture-inducing configurations. In addition or as an alternative to the pattern, a coating may be utilized to increase friction between the stamp 120 and the ring 110. One such coating includes double-sided tape, such as a polyimide tape having a silicone adhesive disposed on both sides thereof. It is contemplated that the double-sided adhesive tape may be removed and replaced after a predetermined number of operations in order to maintain a threshold friction force between the ring 110 and the stamp 120, as well as to reduce the occurrence of undesired particle generation. Increasing frictional forces between the ring 110 and the stamp 120 and/or the substrate 201 and the stamp 120 reduces slipping of the stamp 120 relative to a substrate. For example, a substrate 201 may be maintained in position by the ring 110, and thus, reducing movement between the ring 110 and the stamp (via increased frictional forces) correspondingly reduces movement between the substrate 201 and stamp during a stamping operation. Thus, stamping accuracy is improved. The amount of lateral displacement (e.g., slippage) of the stamp 120 (shown in FIG. 1) in reference to the substrate support substrate 201 is inversely related to the frictional forces between the ring 110 and the stamp 120. After multiple batches of substrates 201 are processed, the displacement of the stamp 120 can be measured by comparing the absolute pattern location of the stamp 120 throughout batches of the processed substrates 201.

FIG. 4A is a schematic, top view of a ring 110 having a grid pattern according to embodiments of the disclosure. FIG. 4B is a schematic, cross-sectional view of the ring 110 of FIG. 4A according to embodiments. A top surface 301 of the ring 110 is patterned with a grid pattern that increases the friction between the stamp 120 and the ring 110, thereby reducing slip of the stamp 120 relative to the substrate 201. While a grid pattern is shown, other textured surfaces are also contemplated. In some embodiments, which can be combined with other embodiments, the top surface 301 off the ring 110 is machined or 3D-printed in order to achieve the grid pattern. In some embodiments, which can be combined with other embodiments, a distance between the top surface of the ring 110 and a top of the grid pattern is from about 0.05 mm to about 0.5 mm. In some embodiments, which can be combined with other embodiments, the grid pattern comprises trenches and/or lines, and may be disposed in a cross-hatch pattern. The width of the trenches and/or lines is about 20 micrometers (hereafter μm) to about 200 μm, for example about 20 μm to about 100 μm, for example about 100 μm to about 200 μm. An inner diameter 401 of the ring 110 is greater than the diameter 304 of the substrate 201 to be processed. In some embodiments, which can be combined with other embodiments, the inner diameter 401 of the ring 110 is between about 5 mm to about 10 mm greater than the diameter 304 of the substrate 201 to be processed. For example, an outer diameter 402 of the ring 110 is between about 10 mm and about 70 mm larger than the inner diameter 401 of the ring 110, such as between about 30 mm and about 60 mm, such as about 40 mm.

FIG. 5A is a schematic, top view of a ring 110 having a pattern of pointed features 501 according to embodiments, and FIG. 5B is a schematic, cross-sectional view of the ring 110 of FIG. 5A according to embodiments. A plurality of pointed (e.g., pyramidal) features 501 are disposed on the top surface 301 of the ring 110 to form the pattern, e.g., a pointed pattern. The pointed features 501 may be monolithic with the ring 110 and/or formed of the same material, or features 501 may be formed from a material different than the remainder of the ring 110. The pattern increases the friction between the stamp 120 and the ring 110, thereby reducing slip of the stamp 120 relative to the substrate 201. In some embodiments, which can be combined with other embodiments, the top surface 301 off the ring 110 is machined, 3D-printed, knurled, or sandblasted in order to achieve the pattern pointed features 501. In some embodiments, which can be combined with other embodiments, a distance between the top surface of the ring 110 and a top of the pattern of pointed features 501 is between about 0.05 mm to about 0.5 mm. An inner diameter 401 of the ring 110 is greater than the diameter 304 of the substrate 201 to be processed. In some embodiments, which can be combined with other embodiments, the inner diameter 401 of the ring 110 is between about 5 mm to about 10 mm greater than the diameter 304 of the substrate 201 to be processed. In some embodiments, an outer diameter 402 of the ring 110 is between about 10 mm and about 70 mm larger than the inner diameter 401 of the ring 110, such as between about 30 mm and about 60 mm, such as about 40 mm.

Figure 6:
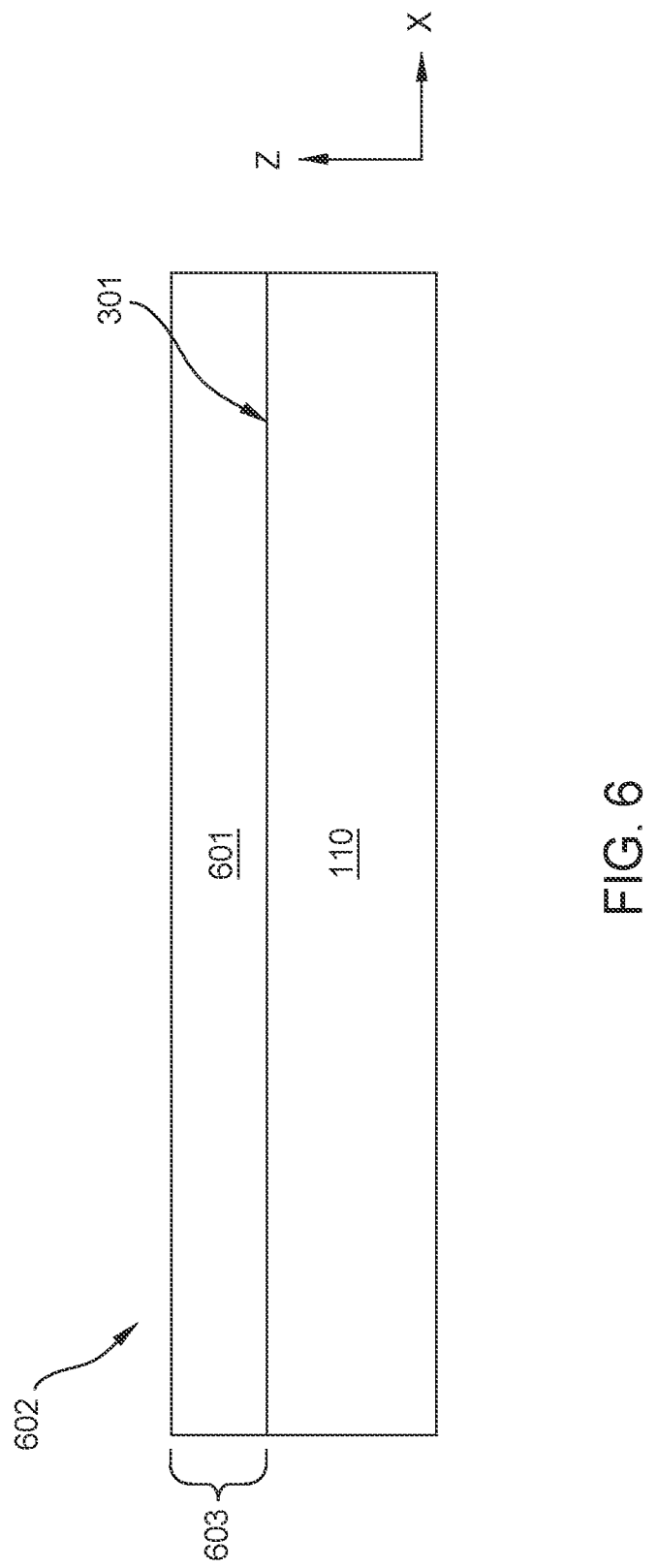
FIG. 6 is a schematic, cross-sectional view of a ring having an adhesive coating according to embodiments of the disclosure.

FIG. 6 is a schematic, cross-sectional view of the ring 110 with an adhesive layer 601 formed thereon. In some embodiments, which can be combined with other embodiments, the adhesive layer 601 contains silicon or silicone adhesive. The adhesive layer 601 is applied through a spray-on coating process, laminating process, doctor blading process, dip coating process, blushing process, roller coating process, or any other suitable process, such as application of a double-sided tape. A thickness 603 of the adhesive layer is about 10 μm to about 100 μm. A top surface 602 of the adhesive layer 601 binds the stamp 120 to the ring 110 for the duration of the stamping process, resulting in reduced slipping between the stamp 120 and the substrate 201. When using a double-sided tape, it is contemplated that adhesion on the lower surface of the double sided tape (E.g., between the adhesive layer 601 and the ring 110) may be greater than the adhesion at the upper surface of the adhesive layer 601 to reduce the likelihood of inadvertently transferring the adhesive layer 601 to a stamp during processing. The variance in adhesiveness may be obtained by using different amounts of adhesive, different compositions of adhesive, or through one or more curing techniques.

Figure 7:
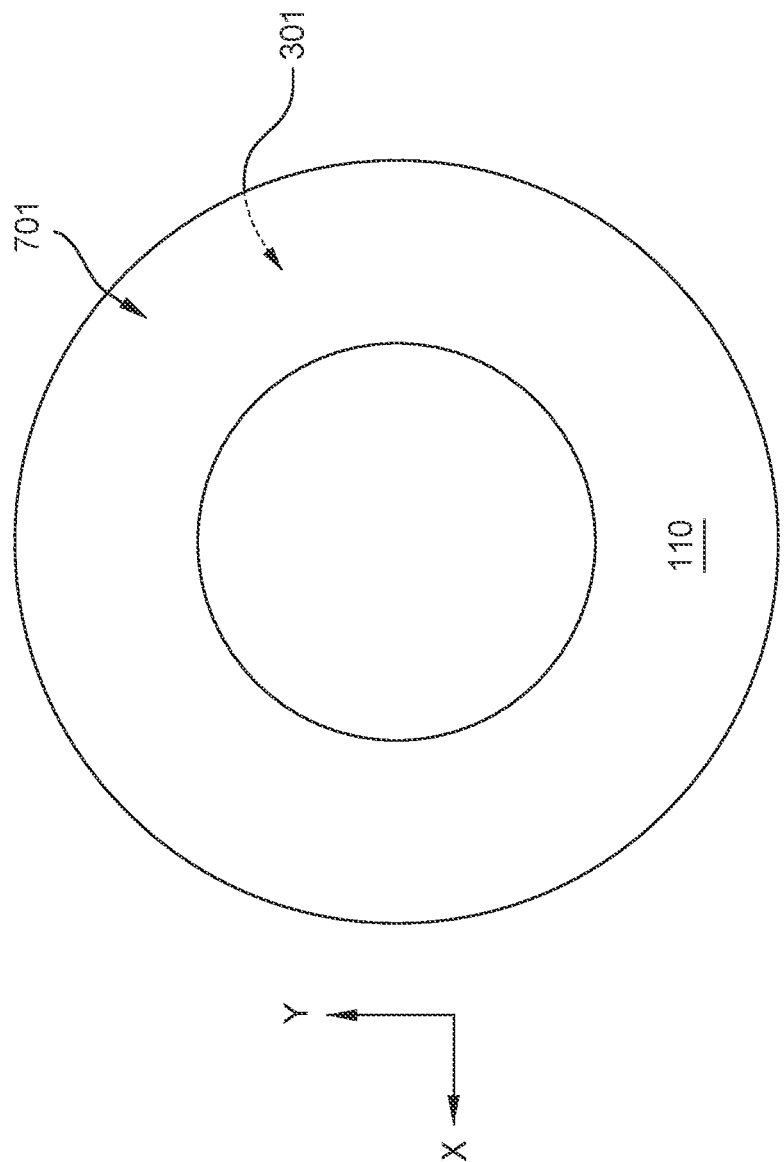
FIG. 7 is a schematic, bottom view of a ring according to embodiments of the disclosure.

FIG. 7 is a schematic, bottom view of the ring 110 according to embodiments. A bottom surface 701 of the ring 110 is smooth and not patterned, in contrast to the top surface 301 of the ring 110. As described above, the top surface 301 of the ring 110 may be patterned with a grid pattern or a pattern of pointed features, or coated with an adhesive layer. The bottom surface 701 of the ring 110 faces the substrate support 101 and has a different pattern (e.g., unpatterned) compared to the pattern of the top surface 301 of the ring 110. In one example, the bottom surface 701 has a surface roughness less 20 micron, such as less than 10 micron, or less than 5 micron, or less than 1 micron, or less than 0.5 micron, or less than 0.1 micron.

In summation, apparatus and methods for performing nanoim print lithography using an anti-slip landing ring are described herein. The proper alignment of the stamp with the substrate using the anti-slip landing ring improves processing uniformity by ensuring that the substrate is patterned evenly. By increasing the frictional forces of the ring on the stamp, slippage, and subsequent misalignment, of the stamp relative to the substrate is minimized.

While the foregoing is directed to embodiments of the present disclosure, other and further embodiments of the disclosure may be devised without departing from the basic scope thereof, and the scope thereof is determined by the claims that follow.

What is claimed is:

1. A process chamber for nanoimprint lithography, comprising:
    a substrate support; and
    a ring disposed on the substrate support, the ring having a top surface opposite the substrate support and a bottom surface opposite the top surface, and wherein the top surface has a grid pattern, and the bottom surface has a different pattern than the top surface.

2. The process chamber of claim 1, wherein the substrate support is a vacuum chuck.

3. The process chamber of claim 2, wherein a thickness of the ring is within a range of about 0.3 mm to about 10 mm.

4. The process chamber of claim 3, wherein the thickness of the ring is about 1 mm.

5. The process chamber of claim 4, wherein features of the grid have a height of about 0.05 mm to about 0.5 mm.

6. The process chamber of claim 3, wherein a thickness of the ring is within a range of about 0.3 mm to about 10 mm.

7. A process chamber for nanoimprint lithography, comprising:
   a substrate support; and
   a ring disposed on the substrate support, the ring having a top surface opposite the substrate support and a bottom surface opposite the top surface, and wherein the top surface has a pattern of pointed features and the bottom surface has a different pattern than the top surface.

8. The process chamber of claim 7, wherein the substrate support is an electrostatic chuck.

9. The process chamber of claim 8, wherein a thickness of the ring is within a range of about 0.3 mm to about 10 mm.

10. The process chamber of claim 9, wherein the thickness of the ring is about 0.7 mm to about 1.0 mm.

11. The process chamber of claim 10, wherein a distance between the top surface and a top of the pattern of pointed features is about 0 mm to about 0.5 mm.

12. The process chamber of claim 9, wherein the bottom surface is planar and unpatterned.

13. A process chamber for nanoim print lithography, comprising:
    a substrate support; and
    a ring disposed on the substrate support, the ring having a top surface opposite the substrate support and a bottom surface opposite the top surface, and wherein the top surface has an adhesive coating disposed thereon and the bottom surface is uncoated with the adhesive.

14. The process chamber of claim 13, wherein the substrate support is an electrostatic or vacuum chuck.

15. The process chamber of claim 14, wherein a thickness of the ring is within a range of about 0.3 mm to about 10 mm.

16. The process chamber of claim 15, wherein the thickness of the ring is about 0.7 mm to about 1.0.

17. The process chamber of claim 16, wherein the adhesive coating has a thickness of about 10 μm to about 100 μm.

18. The process chamber of claim 17, wherein the adhesive coating is a double sided tape.

19. The process chamber of claim 18, wherein the adhesive coating comprises a silicone adhesive.

20. The process chamber of claim 19, wherein the adhesive coating comprises a first silicone coating on a first side of a polyimide substrate, and a second silicone coating on a second side of a polyimide substrate.

\* \* \* \* \*